United States Patent
Kitagawa

(10) Patent No.: US 8,975,690 B2
(45) Date of Patent: Mar. 10, 2015

(54) SEMICONDUCTOR DEVICE

(71) Applicant: Kabushiki Kaisha Toshiba, Minato-ku (JP)

(72) Inventor: Mitsuhiko Kitagawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/970,047

(22) Filed: Aug. 19, 2013

(65) Prior Publication Data
US 2014/0077293 A1    Mar. 20, 2014

(30) Foreign Application Priority Data

Sep. 19, 2012   (JP) ................. 2012-206080

(51) Int. Cl.
   *H01L 29/78*   (2006.01)
   *H01L 29/41*   (2006.01)
(52) U.S. Cl.
   CPC ............ *H01L 29/7827* (2013.01); *H01L 29/41* (2013.01)
   USPC ........... 257/330; 257/133; 257/139; 257/334; 257/E29.027; 257/E29.262
(58) Field of Classification Search
   USPC .......... 257/133, 139, 330, 334, E21.141, 615, 257/29.027, 197, 201, 262
   See application file for complete search history.

(56) References Cited

U.S. PATENT DOCUMENTS

| | | | |
|---|---|---|---|
| 5,378,911 A * | 1/1995 | Murakami | 257/334 |
| 5,702,961 A * | 12/1997 | Park | 438/138 |
| 6,656,774 B1 * | 12/2003 | Chow et al. | 438/133 |
| 2008/0191238 A1 | 8/2008 | Madathil et al. | |
| 2008/0197361 A1 | 8/2008 | Ueno | |
| 2008/0251810 A1 * | 10/2008 | Torii | 257/139 |
| 2009/0173995 A1 * | 7/2009 | Takahashi | 257/330 |
| 2010/0285647 A1 | 11/2010 | Ueno | |
| 2011/0129967 A1 * | 6/2011 | Ronsisvalle et al. | 438/135 |
| 2011/0210391 A1 * | 9/2011 | Kitagawa | 257/331 |
| 2012/0025874 A1 * | 2/2012 | Saikaku et al. | 327/109 |
| 2012/0061723 A1 | 3/2012 | Ishii | |
| 2014/0124831 A1 * | 5/2014 | Rahimo et al. | 257/139 |
| 2014/0183562 A1 * | 7/2014 | Kiyosawa et al. | 257/77 |

FOREIGN PATENT DOCUMENTS

JP    2009-054903    3/2009

* cited by examiner

*Primary Examiner* — Michael Lebentritt
(74) *Attorney, Agent, or Firm* — White & Case LLP

(57) ABSTRACT

According to one embodiment, a semiconductor device includes a first semiconductor region of a first conductivity type, a second semiconductor region of the first conductivity type, a third semiconductor region of a second conductivity type, a fourth semiconductor region of the first conductivity type, a fifth semiconductor region of the second conductivity type, a first electrode, a second electrode, and a third electrode. The first electrode is provided together with the first region in a first direction, provided together with the third region in a second direction, and has an end portion of the first region side located nearer to the first semiconductor side than a boundary between the second region and the third region. The second electrode is provided between the first electrode and the first region and is in electrical continuity with the fourth region. The third electrode contacts with the fourth region.

15 Claims, 12 Drawing Sheets

SEMICONDUCTOR DEVICE

CROSS-REFERENCE TO RELATED APPLICATIONS

This application is based upon and claims the benefit of priority from Japanese Patent Application No. 2012-206080, filed on Sep. 19, 2012; the entire contents of which are incorporated herein by reference.

FIELD

Embodiments described herein relate generally to a semiconductor device.

BACKGROUND

For miniaturization of semiconductor devices, the trench gate structure with the gate electrode formed in the trench is adopted. In the trench gate structure, the current channel is formed in the vertical direction perpendicular to the substrate. Thus, the lateral gate spacing can be narrowed. Accordingly, the device structure can be miniaturized, and the effective channel width can be widened. This makes on-resistance lower than in the gate structure in which the channel is formed in the lateral direction. Furthermore, because the device size is reduced, the trench gate structure is also advantageous in increasing the switching rate to achieve higher performance.

In such a semiconductor device, compatibility between lower on-resistance and higher breakdown voltage is important.

DETAILED DESCRIPTION

Figure 1:
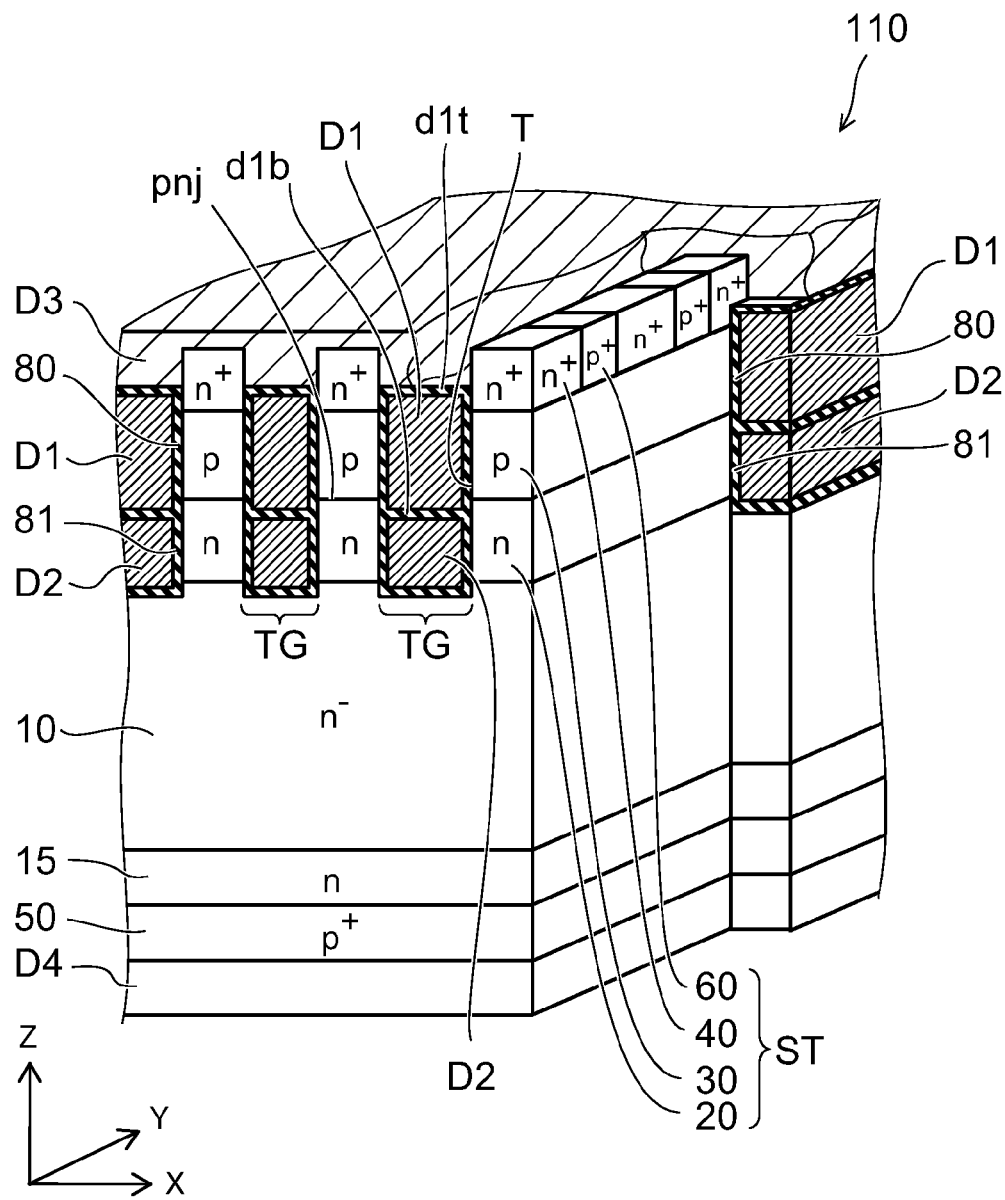
FIG. 1 is a schematic perspective view illustrating the configuration of a semiconductor device according to a first embodiment.

In general, according to one embodiment, a semiconductor device includes a first semiconductor region of a first conductivity type, a second semiconductor region of the first conductivity type, a third semiconductor region of a second conductivity type, a fourth semiconductor region of the first conductivity type, a fifth semiconductor region of the second conductivity type, a first electrode, a second electrode, and a third electrode. The second semiconductor region is provided in contact with the first semiconductor region and has an impurity concentration higher than an impurity concentration of the first semiconductor region. The third semiconductor region is provided on a side opposite to the first semiconductor region of the second semiconductor region and is in contact with the second semiconductor region. The fourth semiconductor region is in contact with at least part of the third semiconductor region and has an impurity concentration higher than an impurity concentration of the second semiconductor region. The fifth semiconductor region of the second conductivity type is provided on a side opposite to the second semiconductor region of the first semiconductor region. The first electrode is provided together with the first semiconductor region in a first direction. The first electrode is provided together with the third semiconductor region in a second direction. The first electrode has an end portion of the first semiconductor region side located nearer to the first semiconductor side than a boundary between the second semiconductor region and the third semiconductor region. A stacking direction of the first semiconductor region and the second semiconductor region is defined as a first direction, a direction orthogonal to the first direction is defined as the second direction, and a direction orthogonal to the first direction and the second direction is defined as a third direction. The second electrode is provided between the first electrode and the first semiconductor region. The second electrode is in electrical continuity with the fourth semiconductor region. The third electrode is in contact with the fourth semiconductor region.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

In the following description, by way of example, the first conductivity type is n-type, and the second conductivity type is p-type.

In the following description, the notations of $n^+$, $n$, $n^-$ and $p^+$, $p$, $p^-$ represent relative magnitude of impurity concentration in each conductivity type. That is, $n^+$ represents relatively higher n-type impurity concentration than n, and $n^-$ represents relatively lower n-type impurity concentration than n. Similarly, $p^+$ represents relatively higher p-type impurity concentration than p, and $p^-$ represents relatively lower p-type impurity concentration than p.

(First Embodiment)

FIG. 1 is a schematic perspective view illustrating the configuration of a semiconductor device according to a first embodiment.

More specifically, FIG. 1 shows a schematic perspective view in which part of the semiconductor device 110 according to the first embodiment is cut away.

As shown in FIG. 1, the semiconductor device 110 according to the first embodiment includes an $n^-$-type drift region (first semiconductor region) 10, an n-type barrier region (second semiconductor region) 20, a p-type base region (third semiconductor region) 30, an $n^+$-type source region (fourth semiconductor region) 40, a $p^+$-type collector region (fifth semiconductor region) 50, a gate electrode (first electrode) D1, an embedded electrode (second electrode) D2, and a source electrode (third electrode) D3.

The semiconductor device 110 is e.g. an IGBT (insulated gate bipolar transistor).

Between the drift region 10 and the collector region 50, an n-type semiconductor region 15 may be provided. The drift region 10 is stacked on the upper surface 50a of the collector region 50 via the n-type semiconductor region 15. In the embodiment, for convenience of description, the n-type semiconductor region 15 is included in the drift region 10.

The barrier region 20 is provided on the drift region 10 and in contact with the drift region 10. In the embodiment, the stacking direction of the drift region 10 and the barrier region 20 is referred to as Z-direction (first direction). A direction orthogonal to the Z-direction is referred to as X-direction (second direction). The direction orthogonal to the Z-direction and the X-direction is referred to as Y-direction (third direction). Furthermore, the term "above" (upper side) is used so that the orientation from the drift region 10 toward the barrier region 20 is directed upward. The term "below" (lower side) is used in the opposite orientation.

In the example shown in FIG. 1, on the drift region 10, a plurality of barrier regions 20 are provided and spaced in the X-direction. Each barrier region 20 extends in the Y-direction.

The impurity concentration of the barrier region 20 is higher than the impurity concentration of the drift region 10. For instance, the impurity concentration of the drift region 10 is approximately $1 \times 10^{13}$ cm$^{-3}$ or more and $1 \times 10^{15}$ cm$^{-3}$ or less. The impurity concentration of the barrier region 20 is higher than the impurity concentration of the drift region 10 (approximately $1 \times 10^{15}$ cm$^{-3}$) and less than $1 \times 10^{17}$ cm$^{-3}$.

The base region 30 is provided on the barrier region 20 and in contact with the barrier region 20. The base region 30 is provided on the side opposite to the drift region 10 of the barrier region 20. The base region 30 extends in the Y-direction along with the barrier region 20. In the case where a plurality of barrier regions 20 are provided, the base region 30 is provided on each barrier region 20.

The source region 40 is provided on the base region 30. The source region 40 is in contact with at least part of the base region 30. The impurity concentration of the source region 40 is higher than the impurity concentration of the drift region 10 and the impurity concentration of the barrier region 20. The impurity concentration of the source region 40 is approximately $1 \times 10^{18}$ cm$^{-3}$ or more and $1 \times 10^{21}$ cm$^{-3}$ or less.

In the semiconductor device 110, a plurality of source regions 40 are provided on the base region 30. Furthermore, in the semiconductor device 110, a plurality of p$^+$-type contact regions (sixth semiconductor regions) 60 are provided on the base region 30. The contact region 60 is provided on the side opposite to the barrier region 20 of the base region 30. Each of the plurality of source regions 40 and each of the plurality of contact regions 60 are arranged alternately in the Y-direction.

The source electrode D3 is provided on the plurality of source regions 40 and the plurality of contact regions 60 and in contact with the plurality of source regions 40 and the plurality of contact regions 60. The source electrode D3 is ohmically connected to the base region 30 via the contact regions 60.

In the semiconductor device 110, the structural body ST made of the barrier region 20, the base region 30, the source region 40, and the contact region 60 on the drift region 10 is provided like a stripe extending in the Y-direction. In the semiconductor device 110, a plurality of structural bodies ST are arranged with a prescribed spacing on the drift region 10.

The collector region 50 is provided below the drift region 10. The collector region 50 is provided on the side opposite to the barrier region 20 of the drift region 10. The collector region 50 is in contact with the n-type semiconductor region 15 of the drift region 10. Below the collector region 50, a collector electrode (fourth electrode) D4 is provided.

The gate electrode D1 is provided on the drift region 10 and provided together with the base region 30 in the X-direction. The lower end d1b of the gate electrode D1 is located below the boundary pnj between the barrier region 20 and the base region 30. In the semiconductor device 110, the upper end d1t of the gate electrode D1 is located above the upper end 30t of the base region 30.

The gate electrode D1 extends in the Y-direction. The gate electrode D1 is made of e.g. a semiconductor material (e.g., polycrystalline silicon) doped with impurity. Alternatively, the gate electrode D1 may be made of metal.

Between the gate electrode D1 and the base region 30, a gate insulating film (insulating film) 80 is provided. The gate insulating film 80 is made of e.g. silicon oxide or silicon nitride. The face of the gate electrode D1 on the base region 30 side is opposed to the face of the base region 30 on the gate electrode D1 side across the gate insulating film 80. In the semiconductor device 110, a channel region is formed in the Z-direction along the surface of the base region 30 opposed to the gate electrode D1. That is, the semiconductor device 110 is based on the trench gate structure TG.

The embedded electrode D2 is provided between the gate electrode D1 and the drift region 10. The embedded electrode D2 is provided together with the barrier region 20 in the X-direction. The embedded electrode D2 is in electrical continuity with the source region 40. That is, the embedded electrode D2 is equipotential with the source electrode D3. The embedded electrode D2 extends in the Y-direction along the gate electrode D1. The embedded electrode D2 functions as e.g. a field plate electrode.

An insulating film 81 is provided between the embedded electrode D2 and the gate electrode D1, between the embedded electrode D2 and the barrier region 20, and between the embedded electrode D2 and the drift region 10. The insulating film 81 may be made of the same material as the gate insulating film 80, or may be made of a different material.

The source electrode D3 is in contact with the source region 40. The source electrode D3 is formed so as to cover the top of the trench gate structure TG and the top of the structural body ST.

In the semiconductor device 110, the trench gate structure TG is provided between adjacent plurality of structural bodies ST. The trench gate structure TG is a structure in which the gate electrode D1 and the embedded electrode D2 are provided in a trench T. The trench T pierces the semiconductor layer for forming the source region 40, the semiconductor layer for forming the contact region 60, the semiconductor layer for forming the base region 30, and the semiconductor layer for forming the barrier region 20, and reaches the drift region 10.

In the semiconductor device 110, the length in the Z-direction (thickness) of the drift region 10 is longer than the length in the Z-direction (depth) of the trench T. For instance, the depth of the trench T is approximately 5 micrometers (μm). The thickness of the drift region 10 is approximately 450 μm. As the thickness of the drift region 10 becomes thicker, the breakdown voltage of the semiconductor device 110 becomes higher.

Next, the operation of the semiconductor device 110 according to the embodiment is described.

Figure 2:
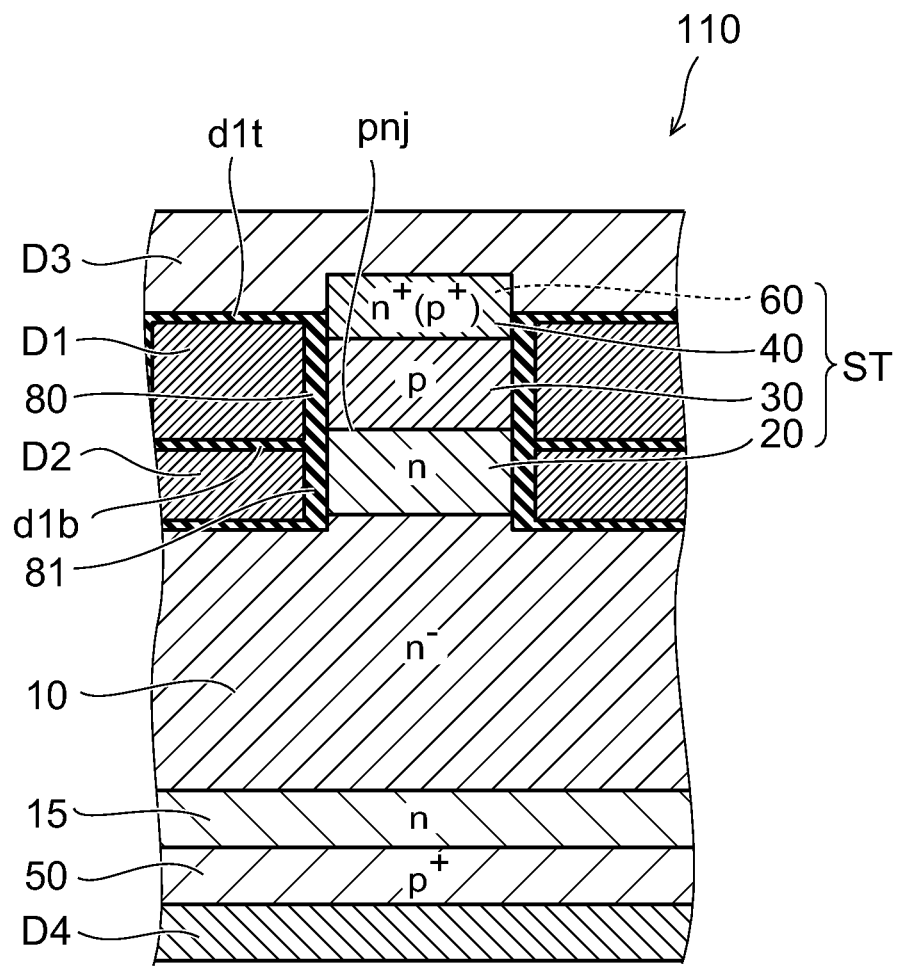
FIG. 2 is a schematic sectional view illustrating an operation of the semiconductor device.

FIG. 2 is a schematic sectional view illustrating the operation of the semiconductor device.

More specifically, FIG. 2 shows a schematic sectional view focused on one structural body ST of the semiconductor device 110.

In FIG. 2, the collector electrode D4 is applied with a high potential, and the source electrode D3 is applied with a low potential lower than the potential of the collector electrode D4. In this state, the gate electrode D1 is applied with a gate potential higher than or equal to the threshold. Then, an inversion layer (channel) is formed near the interface of the base region 30 with the gate insulating film 80.

For instance, the source electrode D3 is applied with the ground potential or a negative potential, and the gate electrode D1 is applied with a positive potential. The collector electrode D4 is applied with a positive potential higher than the gate electrode D1. Thus, electrons are injected from the source region 40 via the channel into the base region 30, and the device is turned on. Furthermore, at this time, holes are injected from the collector region 50 into the drift region 10. The holes injected into the drift region 10 flow from the contact region 60 to the source electrode D3 through the base region 30. In the semiconductor device 110, in the ON state, holes are injected from the collector region 50 into the drift region 10. This causes conductivity modulation and reduces the resistance of the drift region 10.

On the other hand, when the gate electrode D1 is applied with a gate potential lower than the threshold, no channel is formed near the interface of the base region 30 with the gate insulating film 80, and the device is turned off. In the OFF state, holes generated in the drift region 10 are efficiently ejected from the contact region 60 to the source electrode D3. Thus, the holes generated in the drift region 10 by high electric field in the OFF state are efficiently extracted away to improve the breakdown withstand capability.

In the semiconductor device 110 according to the embodiment, the barrier region 20 is provided between the base region 30 and the drift region 10. The provision of the barrier region 20 suppresses that holes injected from the collector region 50 into the drift region 10 flow into the base region 30 in the ON state. This improves the effect of promoting electron injection from the source region 40 into the base region 30. Thus, the amount of electrons stored in the channel is increased, and lower on-resistance is achieved.

Here, if the barrier region 20 having higher impurity concentration than the drift region 10 is provided, the spread of the depletion layer in the OFF state is made narrower than in the case where the barrier region 20 is not provided. This may incur the decrease of breakdown voltage.

In the semiconductor device 110 according to the embodiment, between the gate electrode D1 and the drift region 10, the embedded electrode D2 in electrical continuity with the source electrode D3 is provided. Thus, even if high voltage is applied between the source electrode D3 and the collector electrode D4 in the OFF state, electric field concentration near the end portion on the embedded electrode D2 side of the gate electrode D1 (the lower end d1b of the gate electrode D1) is relaxed. Thus, even if the barrier region 20 is provided, the decrease of breakdown voltage due to the impurity concentration of the barrier region 20 is suppressed.

Furthermore, in the semiconductor device 110, the embedded electrode D2 in electrical continuity with the source electrode D3 is provided below the gate electrode D1. Thus, the semiconductor device 110 has a structure equivalent to the structure in which part of the source electrode D3 is located nearer to the collector electrode D4 side than the gate electrode D1. This structure reduces the gate-collector capacitance and improves the controllability of the gate potential, i.e., the switching controllability. Specifically, this suppresses the decrease of switching rate due to the gate-collector capacitance.

(Second Embodiment)

Next, a method for manufacturing a semiconductor device according to a second embodiment is described.

FIG. 3A to FIG. 7 are schematic sectional views illustrating the method for manufacturing a semiconductor device.

Figure 3A:
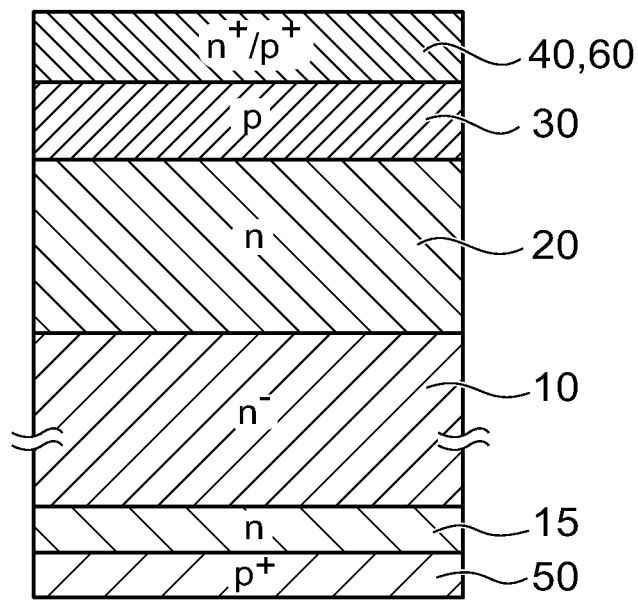
FIG. 3A to FIG. 7 are schematic sectional views illustrating a method for manufacturing a semiconductor device.

First, as shown in FIG. 3A, on a collector region 50 made of a p$^+$-type semiconductor substrate, an n-type semiconductor region 15 is formed. On the n-type semiconductor region 15, an n$^-$-type drift region 10 is formed. Furthermore, on the drift region 10, an n-type barrier region 20 is formed. Furthermore, on the barrier region 20, a p-type base region 30 is formed. On the base region 30, an n$^+$-type source region 40 and a p$^+$-type contact region 60 are formed.

The n-type semiconductor region 15, the drift region 10, the barrier region 20, the base region 30, the source region 40, and the contact region 60 are formed by e.g. epitaxial growth technique. The source region 40 and the contact region 60 are formed alternately in the Y-direction. The impurity concentration of the drift region 10 is approximately $1\times10^{15}$ cm$^{-3}$. The impurity concentration of the barrier region 20 is higher than the impurity concentration of the drift region 10 (approximately $1\times10^{15}$ cm$^{-3}$) and less than $1\times10^{17}$ cm$^{-3}$. The impurity concentration of the source region 40 is e.g. approximately $1\times10^{18}$ cm$^{-3}$.

Figure 3B:
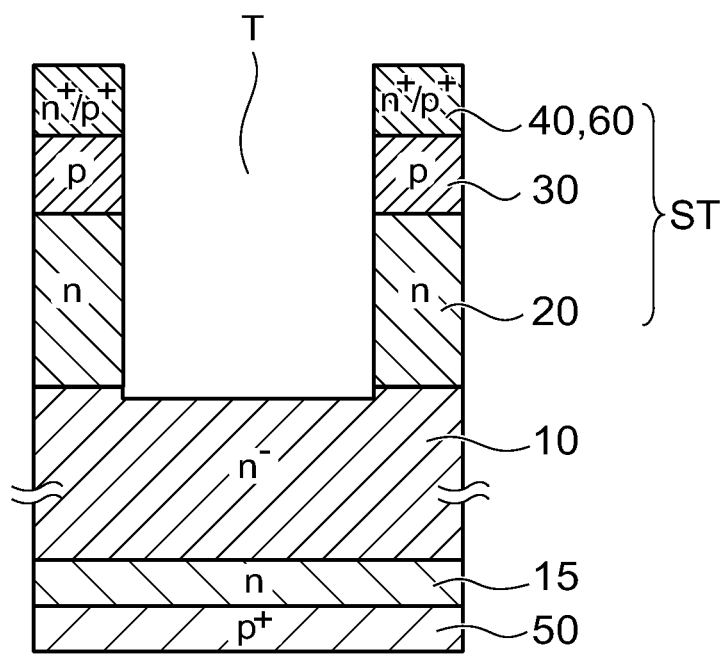

Next, as shown in FIG. 3B, a trench T extending from the surface of the source region 40 and the contact region 60 to the drift region 10 is formed. The trench T is formed by e.g. RIE (reactive ion etching). The trench T extends in the Y-direction. By the formation of the trench T, structural bodies ST are configured on both sides in the X-direction of the trench T.

Figure 4A:
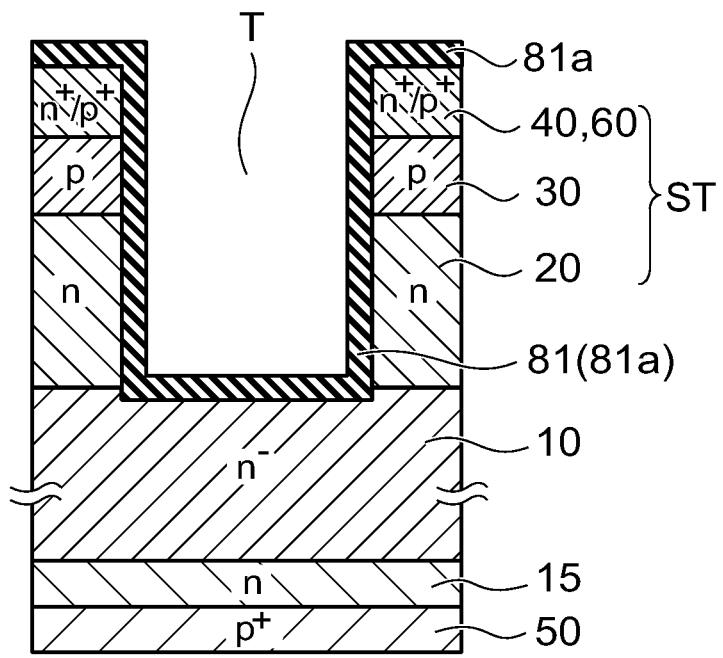

Next, as shown in FIG. 4A, an insulating film material 81a covering the inner wall of the trench T is formed. The insulating film material 81a is made of e.g. SiO$_2$. The insulating film material 81a formed on the barrier region 20 exposed to the inner wall of the trench T forms an insulating film 81.

Figure 4B:
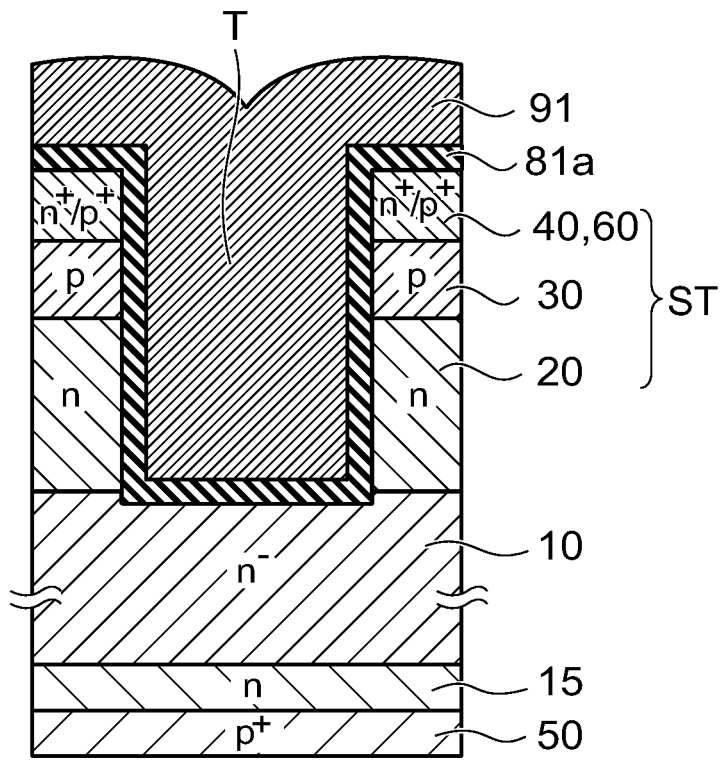

Next, as shown in FIG. 4B, a conductive material 91 is formed on the insulating film material 81a. The conductive material 91 is made of e.g. polycrystalline silicon doped with impurity. The conductive material 91 is formed so as to embed the trench T.

Figure 5A:
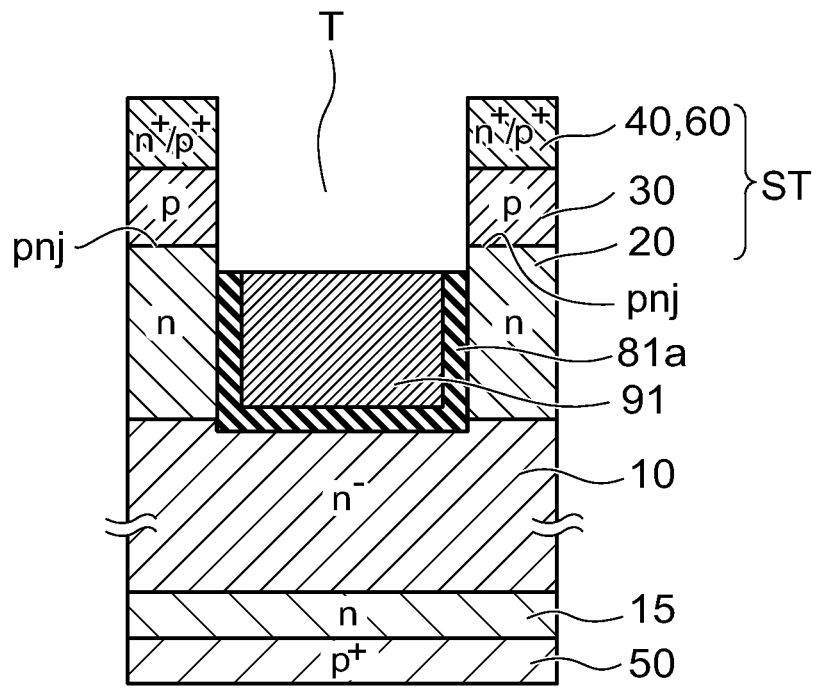

Next, as shown in FIG. 5A, the conductive material 91 and the insulating film material 81a are etched back and partly removed. The conductive material 91 and the insulating film material 81a are etched back to below the boundary pnj between the barrier region 20 and the base region 30.

Figure 5B:
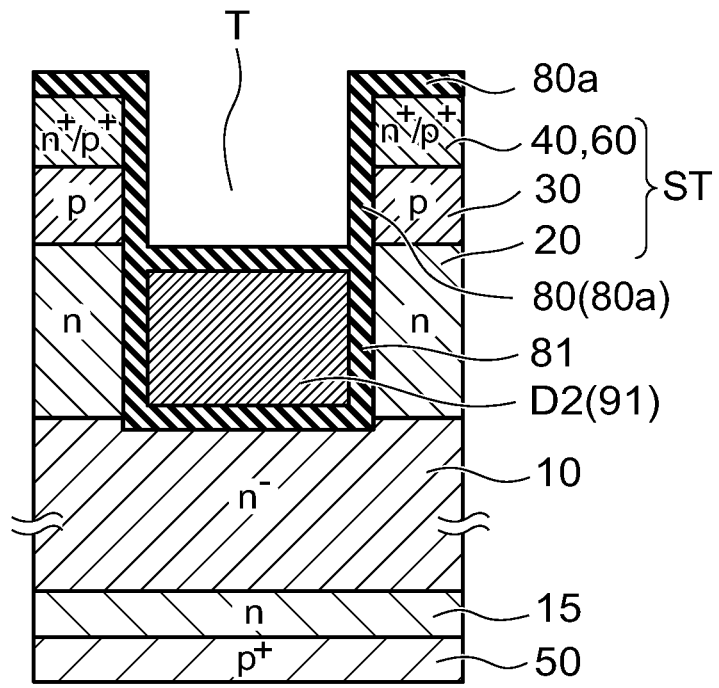

Next, as shown in FIG. 5B, on the conductive material 91 and the insulating film material 81a after the etch-back, an insulating film material 80a is formed. The insulating film material 80a is made of e.g. SiO$_2$. The insulating film material 80a formed on the base region 30 exposed to the inner wall of the trench T by the etch-back of the conductive material 91 and the insulating film material 81a forms a gate insulating film 80.

Figure 6A:
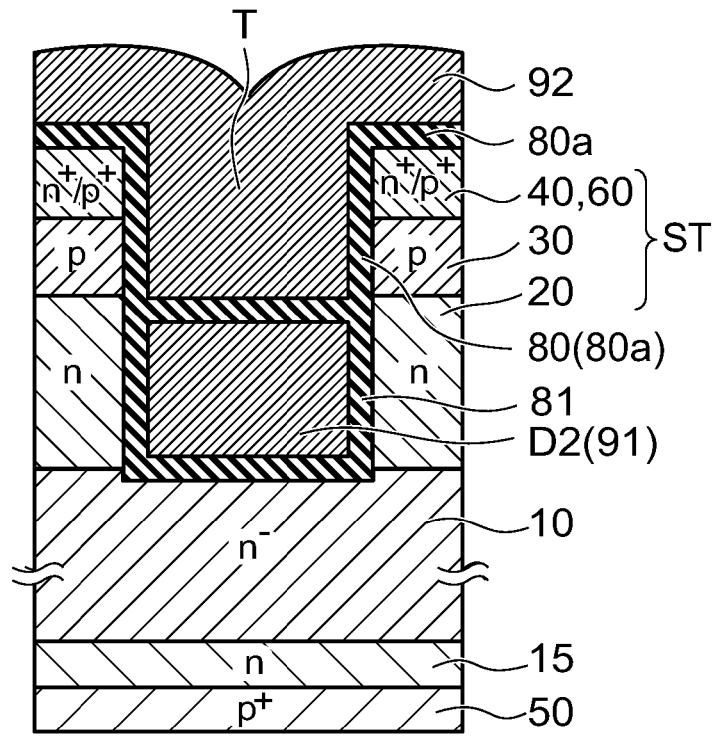

Next, as shown in FIG. 6A, a conductive material 92 is formed on the insulating film material 80a. The conductive material 92 is made of e.g. polycrystalline silicon doped with impurity. The conductive material 92 is formed so as to embed the trench T. In the trench T, the insulating film material 80a provided between the conductive material 91 and the conductive material 92 forms the insulating film 81. In the trench T, the conductive material 91 surrounded with the insulating film 81 forms an embedded electrode D2.

Figure 6B:
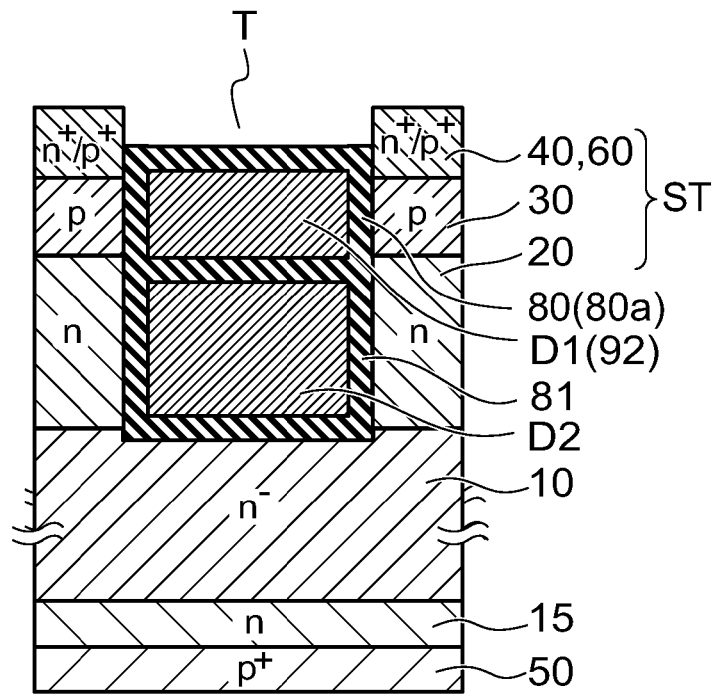

Next, as shown in FIG. 6B, the conductive material 92 and the insulating film material 80a are etched back and partly removed. The conductive material 92 and the insulating film material 80a are etched back to a position slightly above the boundary between the base region 30 and the source region 40

(contact region 60). Then, on the conductive material 92 and the insulating film material 80a after the etch-back, an insulating film material 82a is formed. In the trench T, the conductive material 92 surrounded with the insulating film material 82a and the gate insulating film 80 made of the insulating film material 80a forms a gate electrode D1.

Figure 7:
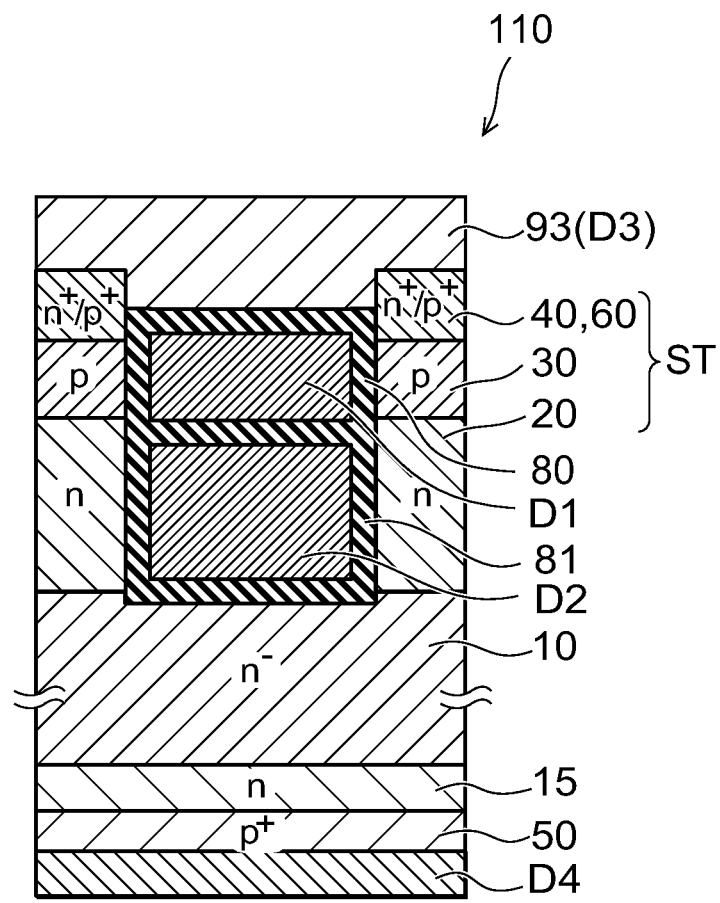

Next, as shown in FIG. 7, a conductive material 93 is formed on the insulating film material 82a and on the source region 40 and the contact region 60. This conductive material 93 forms a source electrode D3. Furthermore, below the collector region 50, a collector electrode D4 in contact with the collector region 50 is formed. Here, the collector electrode D4 may be formed in an earlier step. Thus, the semiconductor device 110 is completed.

(Third Embodiment)

Next, a semiconductor device according to a third embodiment is described.

Figure 8:
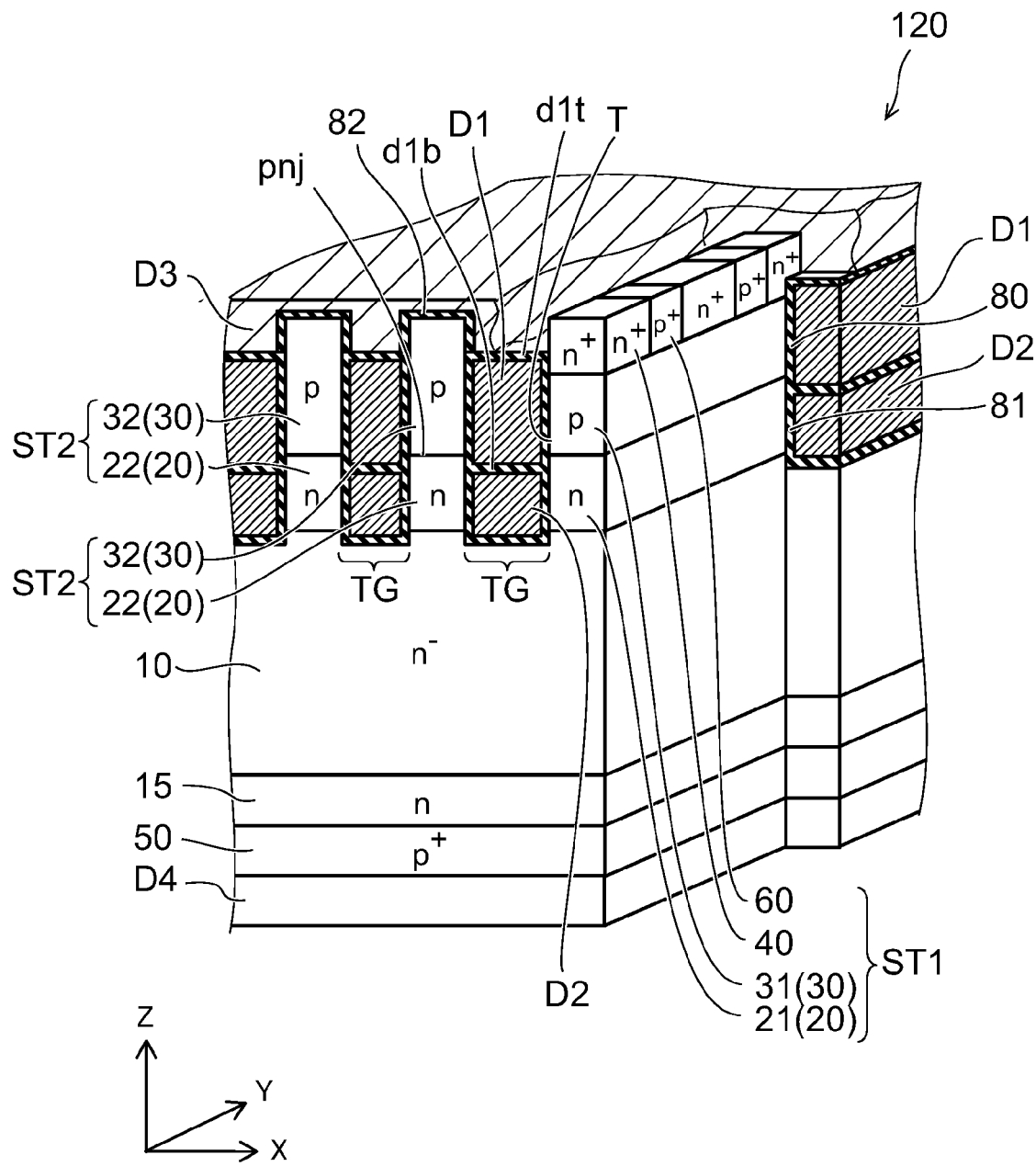
FIG. 8 is a schematic perspective view illustrating the configuration of a semiconductor device according to a third embodiment.

FIG. 8 is a schematic perspective view illustrating the configuration of the semiconductor device according to the third embodiment.

More specifically, FIG. 8 shows a schematic perspective view in which part of the semiconductor device 120 according to the third embodiment is cut away.

As shown in FIG. 8, in the semiconductor device 120 according to the third embodiment, the configuration of the barrier region 20 being the second semiconductor region and the base region 30 being the third semiconductor region is different from the configuration in the semiconductor device 110 according to the first embodiment.

In the semiconductor device 120, the barrier region 20 includes a first barrier region 21 provided on one side in the X-direction of the embedded electrode D2, and a second barrier region 22 provided on the other side in the X-direction of the embedded electrode D2. Furthermore, in the semiconductor device 120, the base region 30 includes a first base region 31 provided on the first barrier region 21 and in contact with the first barrier region 21, and a second base region 32 provided on the second barrier region 22 and in contact with the second barrier region 22. The first base region 31 is provided on the side opposite to the drift region 10 of the first barrier region 21. The second base region 32 is provided on the side opposite to the drift region 10 of the second barrier region 22.

In the semiconductor device 120, on the first base region 31, the source region 40 is provided. That is, the source region 40 is provided on the side opposite to the first barrier region 21 of the first base region 31. On the other hand, on the second base region 32, the source region 40 is not provided. That is, the source region 40 is not provided on the side opposite to the second barrier region 22 of the second base region 32.

On the first base region 31, a plurality of source regions 40 and a plurality of contact regions 60 are provided alternately in the Y-direction. A source electrode D3 is provided on the plurality of source regions 40 and the plurality of contact regions 60. The source electrode D3 is in contact and electrical continuity with the source region 40 and the contact region 60.

An insulating film 82 is provided between the second base region 32 and the source electrode D3. That is, the second base region 32 is not in electrical continuity with the source electrode D3.

In the semiconductor device 120, the first barrier region 21, the first base region 31, the source region 40, and the contact region 60 form a first structural body ST1. The second barrier region 22 and the second base region 32 form a second structural body ST2.

In the semiconductor device 120, a plurality of gate electrodes D1 are arranged with a prescribed spacing in the X-direction. Between adjacent plurality of gate electrodes D1, the first structural body ST1 or the second structural body ST2 is placed. The first structural body ST1 is placed at a rate of one in every plurality of second structural bodies ST2 arranged in the X-direction. Here, the semiconductor device 120 may include a plurality of first structural bodies ST1 and a plurality of second structural bodies ST2, each of first structural bodies ST1 and each of the second structural bodies ST2 may be arranged alternately in the X-direction.

This semiconductor device 120 is e.g. an IEGT (injection enhanced gate transistor).

Next, the operation of the semiconductor device 120 according to the embodiment is described.

In FIG. 8, the collector electrode D4 is applied with a high potential, and the source electrode D3 is applied with a low potential lower than the potential of the collector electrode D4. In this state, the gate electrode D1 is applied with a gate potential higher than or equal to the threshold. Then, a channel is formed near the interface of the first base region 31 of the first structural body ST1 with the gate insulating film 80. In the semiconductor device 120, the channel is formed only in the first base region 31 of the first structural body ST1. No channel is formed in the second base region 32 of the second structural body ST2.

Thus, electrons are injected from the source region 40 via the channel into the first base region 31, and the device is turned on. Furthermore, at this time, holes are injected from the collector region 50 into the drift region 10.

The holes injected into the drift region 10 flow from the contact region 60 to the source electrode D3 through the first base region 31. In the semiconductor device 120, in the ON state, holes are injected from the collector region 50 into the drift region 10. This causes conductivity modulation and reduces the resistance of the drift region 10.

On the other hand, when the gate electrode D1 is applied with a gate potential lower than the threshold, no channel is formed near the interface of the first base region 31 with the gate insulating film 80, and the device is turned off. In the semiconductor device 120, the operation in the OFF state is similar to that in the semiconductor device 110.

In the semiconductor device 120, the second base region 32 of the second structural body ST2 is not in electrical continuity with the source electrode D3. Thus, a barrier against holes injected into the drift region 10 is formed. This suppresses inflow of holes into the first base region 31 and improves the effect of promoting electron injection from the source region 40 into the first base region 31. Thus, the amount of electrons stored in the channel is increased, and lower on-resistance is achieved.

In this semiconductor device 120 according to the third embodiment, in addition to working effects similar to those in the semiconductor device 110 according to the first embodiment, the effect of promoting electron injection is greater than in the semiconductor device 110. Thus, even lower on-resistance is achieved.

(Another Example of the Third Embodiment)

Next, a semiconductor device according to another example of the third embodiment is described.

Figure 9:
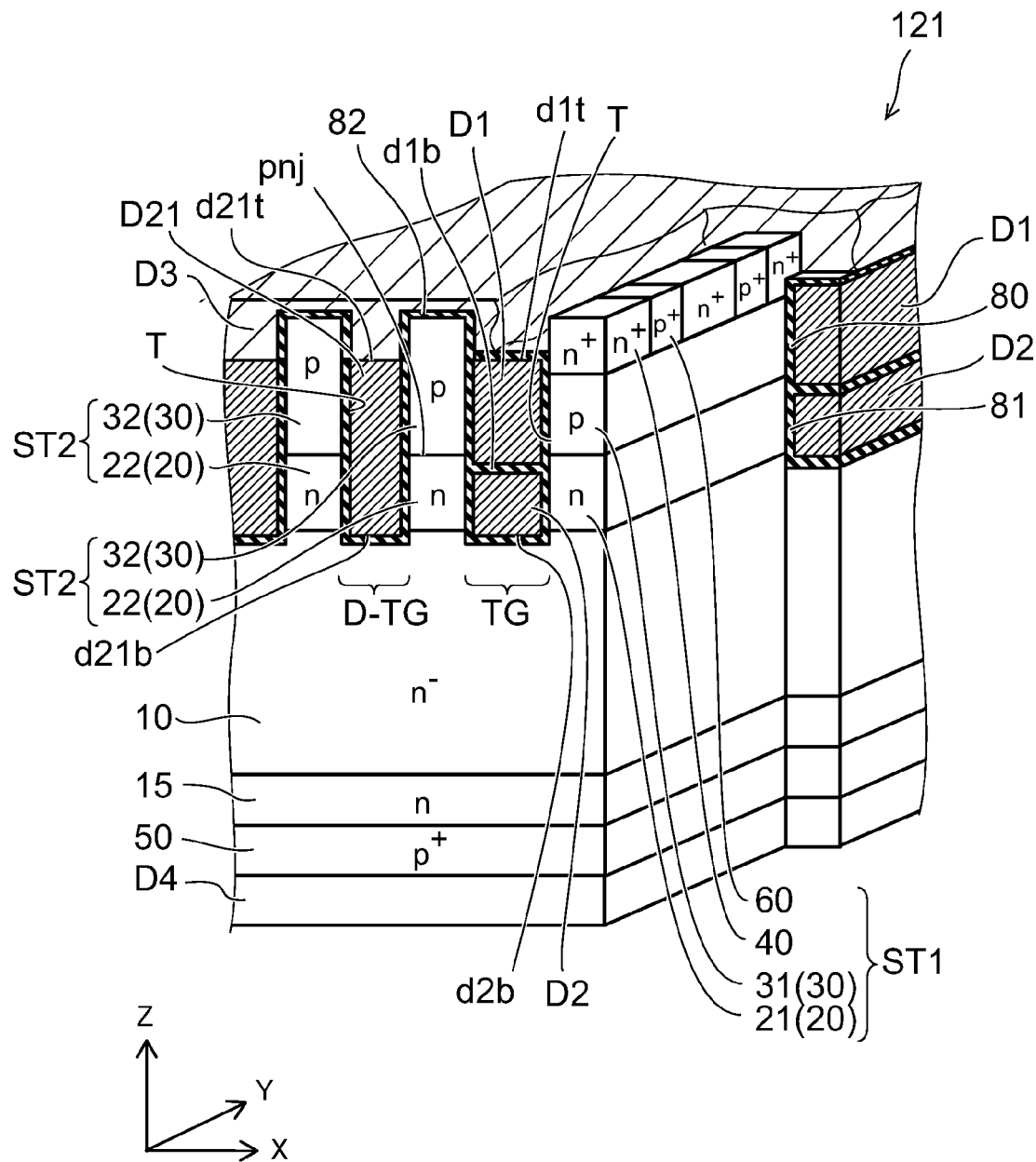
FIG. 9 is a schematic perspective view illustrating the configuration of a semiconductor device according to another example of the third embodiment.

FIG. 9 is a schematic perspective view illustrating the configuration of the semiconductor device according to the another example of the third embodiment.

More specifically, FIG. 9 shows a schematic perspective view in which part of the semiconductor device 121 according to the another example of the third embodiment is cut away.

As shown in FIG. 9, in the semiconductor device 121 according to the another example of the third embodiment, a dummy gate trench D-TG is provided at a position adjacent to the trench gate structure TG in the X-direction. The dummy gate trench D-TG has a structure in which an embedded electrode D21 (second second electrode) is provided in a trench T. The embedded electrode D21 is, at the upper end d21t, in electrical continuity with the source electrode D3. The embedded electrode D21 is ohmically connected to the source electrode D3. The position of the upper end d21t of the embedded electrode D21 is nearly equal to the position of the upper end d1t of the gate electrode D1. The position of the lower end d21b of the embedded electrode D21 is nearly equal to the position of the lower end d2b of the embedded electrode D2 in the trench gate structure TG.

Each of a plurality of trench gate structures TG and each of a plurality of dummy gate trenches D-TG may be provided alternately in the X-direction. Alternatively, a plurality of dummy gate trenches D-TG may be provided between adjacent plurality of trench gate structures TG.

Next, the operation of the semiconductor device 121 according to the embodiment is described.

In FIG. 9, the collector electrode D4 is applied with a high potential, and the source electrode D3 is applied with a low potential lower than the potential of the collector electrode D4. In this state, the gate electrode D1 is applied with a gate potential higher than or equal to the threshold. Then, a channel is formed near the interface of the first base region 31 of the first structural body ST1 with the gate insulating film 80. In the semiconductor device 121, the channel is formed only in the first base region 31 of the first structural body ST1. No channel is formed in the second base region 32 of the second structural body ST2.

Thus, electrons are injected from the source region 40 via the channel into the first base region 31, and the device is turned on. Furthermore, at this time, holes are injected from the collector region 50 into the drift region 10.

The holes injected into the drift region 10 flow from the contact region 60 to the source electrode D3 through the first base region 31. In the semiconductor device 121, in the ON state, holes are injected from the collector region 50 into the drift region 10. This causes conductivity modulation and reduces the resistance of the drift region 10.

On the other hand, when the gate electrode D1 is applied with a gate potential lower than the threshold, no channel is formed near the interface of the first base region 31 with the gate insulating film 80, and the device is turned off.

In the semiconductor device 121, the embedded electrode D21 is in electrical continuity with the source electrode D3. The embedded electrode D21 is, at the upper end d21t, in electrical continuity with the source electrode D3. This eliminates the need of spatial routing of wiring as compared with the case where the electrode embedded in the trench T (embedded electrode D21) is brought into electrical continuity with the source electrode D3 outside the device region.

(Fourth Embodiment)

Next, a semiconductor device according to a fourth embodiment is described.

Figure 10:
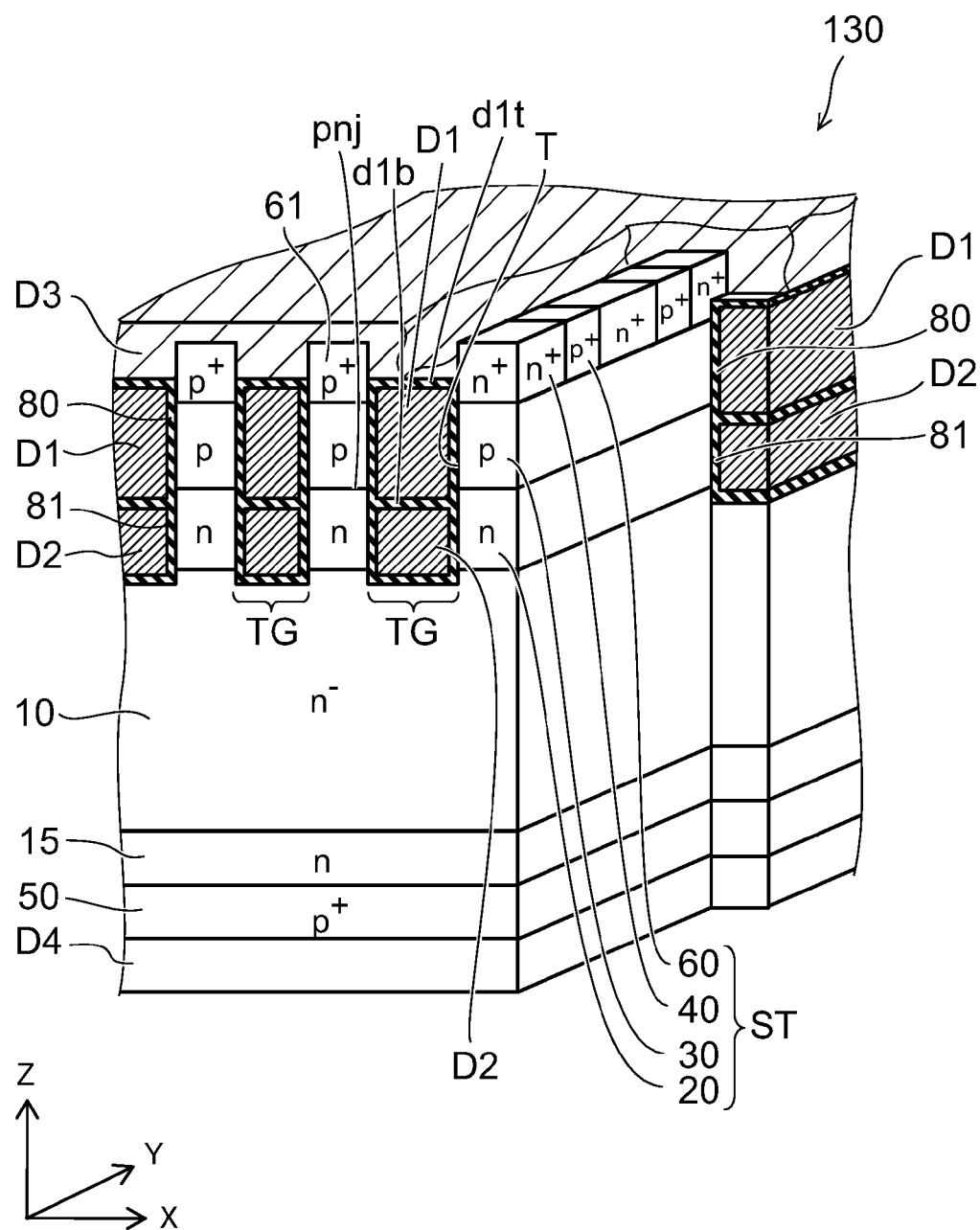
FIG. 10 is a schematic perspective view illustrating the configuration of a semiconductor device according to a fourth embodiment.

FIG. 10 is a schematic perspective view illustrating the configuration of the semiconductor device according to the fourth embodiment.

More specifically, FIG. 10 shows a schematic perspective view in which part of the semiconductor device 130 according to the fourth embodiment is cut away.

As shown in FIG. 10, the semiconductor device 130 according to the fourth embodiment is different from the semiconductor device 120 according to the third embodiment in that the second structural body ST2 is in electrical continuity with the source electrode D3.

In the semiconductor device 130, a p$^+$-type second contact region 62 is provided on the second base region 32 of the second structural body ST2. The second contact region 62 is in contact with the second base region 32 and extends in the Y-direction. The source electrode D3 is in contact with the second contact region 62. Thus, the second base region 32 is in electrical continuity with the source electrode D3 via the second contact region 62.

This semiconductor device 130 is e.g. an IEGT.

Next, the operation of the semiconductor device 130 according to the embodiment is described.

In FIG. 10, the collector electrode D4 is applied with a high potential, and the source electrode D3 is applied with a low potential lower than the potential of the collector electrode D4. In this state, the gate electrode D1 is applied with a gate potential higher than or equal to the threshold. Then, the device is turned on. In the semiconductor device 130, the operation in the ON state is similar to that in the semiconductor device 120.

On the other hand, when the gate electrode D1 is applied with a gate potential lower than the threshold, no channel is formed near the interface of the first base region 31 with the gate insulating film 80, and the device is turned off. In the OFF state, holes generated in the drift region 10 are efficiently ejected from the contact region 60 and the second contact region 62 to the source electrode D3. That is, in the semiconductor device 130, in addition to the contact region 60, holes are ejected also from the second contact region 62. Thus, in the semiconductor device 130, the efficiency of hole ejection in the OFF state is higher than in the semiconductor device 120 in which the second contact region 62 is not provided. This further improves the breakdown withstand capability.

In this semiconductor device 130 according to the fourth embodiment, in addition to working effects similar to those in the semiconductor devices 110 and 120, improvement in breakdown withstand capability is greater than in the semiconductor device 120.

(Another Example of the Fourth Embodiment)

Next, a semiconductor device according to another example of the fourth embodiment is described.

Figure 11:
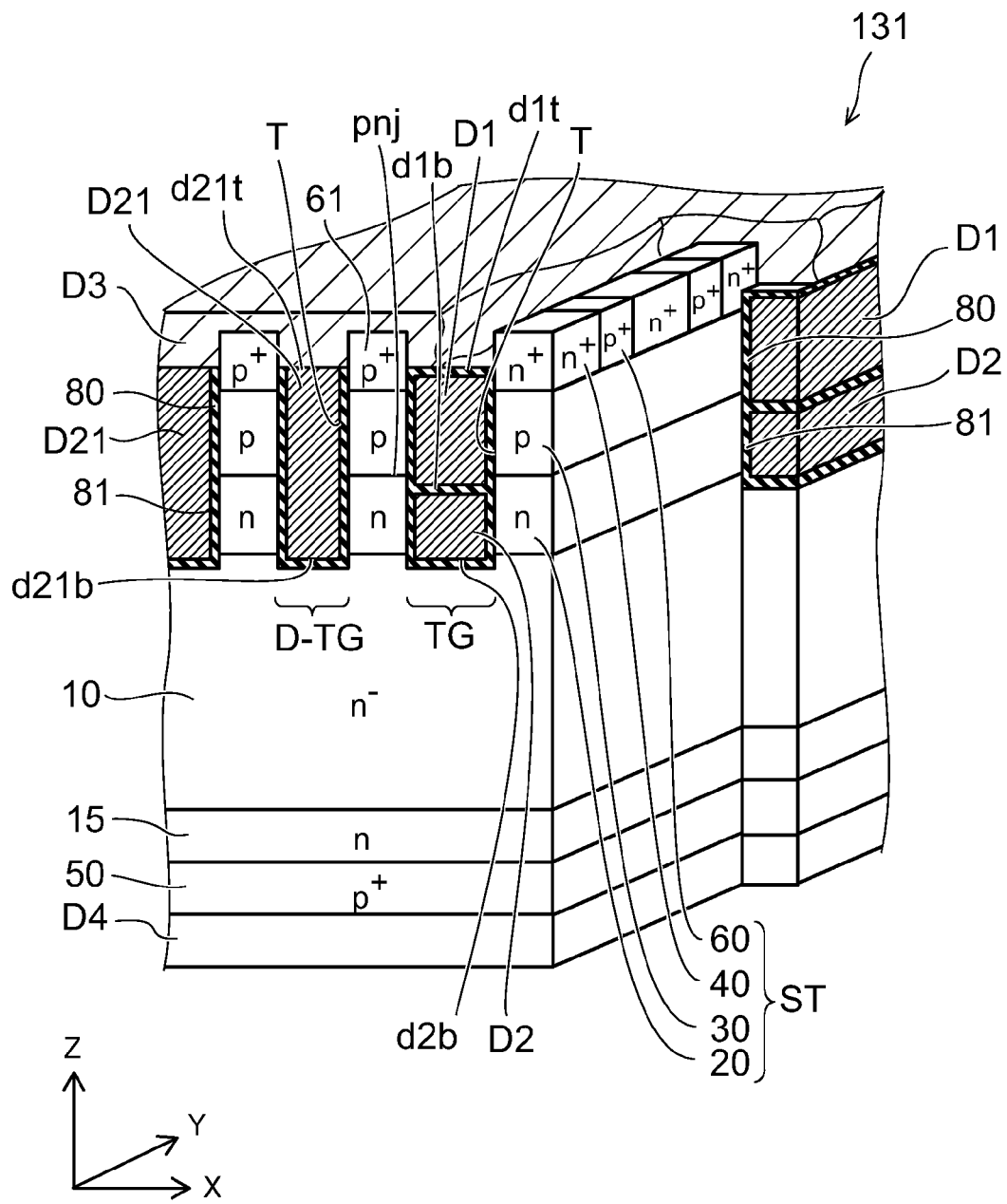
FIG. 11 is a schematic perspective view illustrating the configuration of a semiconductor device according to another example of the fourth embodiment.

FIG. 11 is a schematic perspective view illustrating the configuration of the semiconductor device according to the another example of the fourth embodiment.

More specifically, FIG. 11 shows a schematic perspective view in which part of the semiconductor device 131 according to the another example of the fourth embodiment is cut away.

As shown in FIG. 11, in the semiconductor device 131 according to the another example of the fourth embodiment, a dummy gate trench D-TG is provided at a position adjacent in the X-direction to the trench gate structure TG. The structure in the dummy gate trench D-TG is similar to that in the semiconductor device 121.

Next, the operation of the semiconductor device 131 according to the embodiment is described.

In FIG. 11, the collector electrode D4 is applied with a high potential, and the source electrode D3 is applied with a low potential lower than the potential of the collector electrode D4. In this state, the gate electrode D1 is applied with a gate potential higher than or equal to the threshold. Then, the device is turned on.

On the other hand, when the gate electrode D1 is applied with a gate potential lower than the threshold, no channel is formed near the interface of the first base region 31 with the gate insulating film 80, and the device is turned off.

In the semiconductor device 131, the embedded electrode D21 is in electrical continuity with the source electrode D3. The embedded electrode D21 is, at the upper end d21t, in electrical continuity with the source electrode D3. This eliminates the need of spatial routing of wiring as compared with the case where the electrode embedded in the trench T (embedded electrode D21) is brought into electrical continuity with the source electrode D3 outside the device region.

(Fifth Embodiment)

Next, a semiconductor device according to a fifth embodiment is described.

Figure 12:
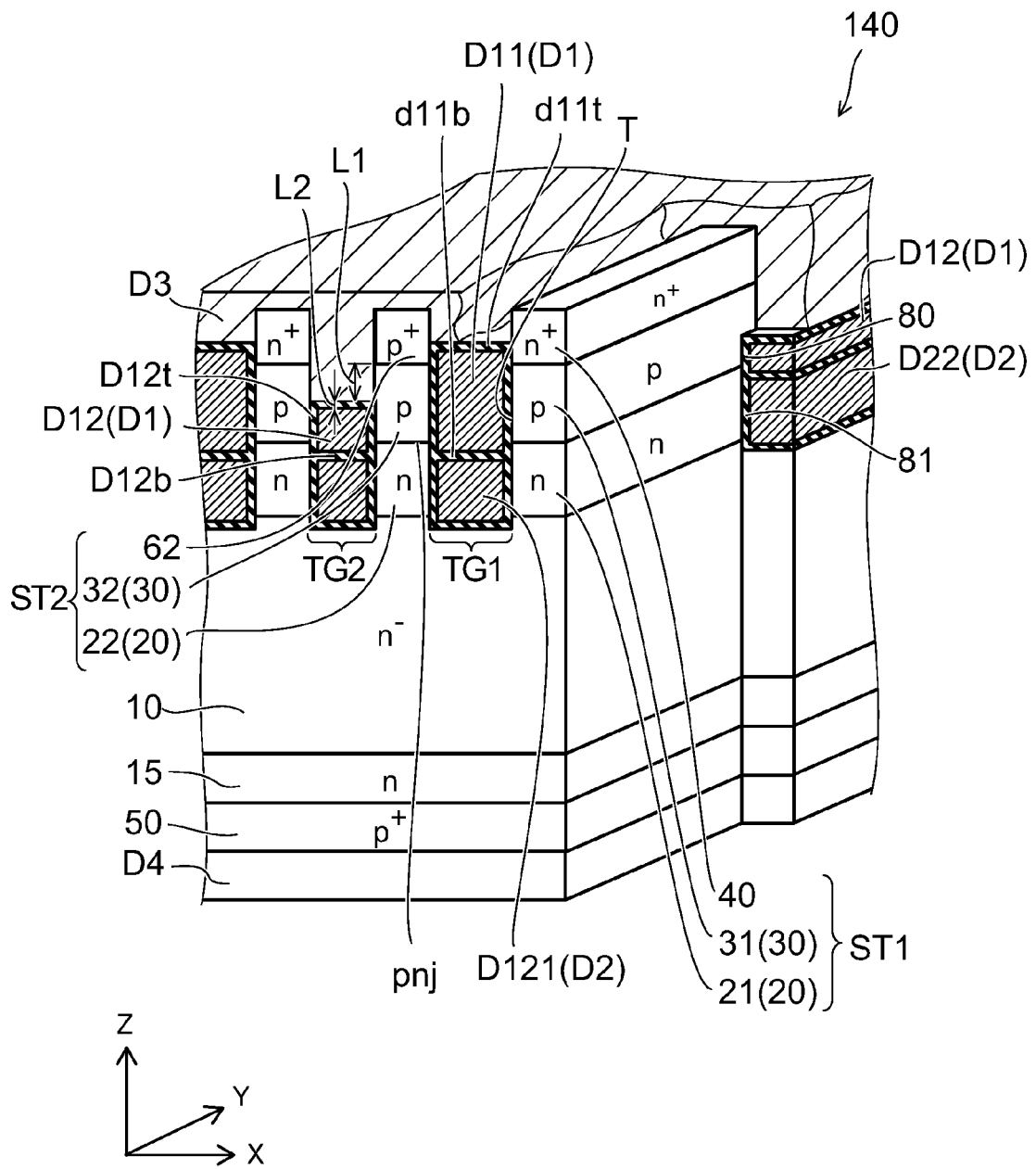
FIG. 12 is a schematic perspective view illustrating the configuration of a semiconductor device according to a fifth embodiment.

FIG. 12 is a schematic perspective view illustrating the configuration of the semiconductor device according to the fifth embodiment.

More specifically, FIG. 12 shows a schematic perspective view in which part of the semiconductor device 140 according to the fifth embodiment is cut away.

As shown in FIG. 12, the semiconductor device 140 according to the fifth embodiment is different from the semiconductor device 130 according to the fourth embodiment in the configuration of the trench gate structure TG. That is, in the configuration of the semiconductor device 140, two kinds of gate electrodes D1 different in length in the Z-direction are arranged alternately in the X-direction.

In the semiconductor device 140, the barrier region 20 includes a first barrier region 21 provided on one side in the X-direction of the embedded electrode D2, and a second barrier region 22 provided on the other side in the X-direction of the embedded electrode D2. Furthermore, in the semiconductor device 140, the base region 30 includes a first base region 31 provided on the first barrier region 21 and in contact with the first barrier region 21, and a second base region 32 provided on the second barrier region 22 and in contact with the second barrier region 22.

In the semiconductor device 140, on the first base region 31, the source region 40 is provided. In the semiconductor device 140, the source region 40 extends in the Y-direction. However, as in the semiconductor device 130 shown in FIG. 10, on the first base region 31, a plurality of source regions 40 and a plurality of contact regions 60 may be provided alternately in the Y-direction. On the other hand, on the second base region 32, the source region 40 is not provided. On the second base region 32, a second contact region 62 is provided.

A source electrode D3 is provided on the source region 40 and the second contact region 62. The source electrode D3 is in contact and electrical continuity with the source region 40 and the second contact region 62.

This semiconductor device 140 is e.g. an IEGT.

In the semiconductor device 140, the first barrier region 21, the first base region 31, and the source region 40 form a first structural body ST1. The second barrier region 22, the second base region 32, and the second contact region 62 form a second structural body ST2.

The gate electrode D1 includes a first gate electrode D11 provided between the first base region 31 and the second base region 32, and a second gate electrode D12 provided on the opposite side of the second base region 32 from the first gate electrode D11. The upper end d11t of the first gate electrode D11 is located above the upper end 31t of the first base region 31 and the upper end 32t of the second base region 32. The upper end d11t is an end portion opposite side to the embedded electrode D2. The upper end 31t is an end portion opposite side to the first barrier region 21 of the first base region 31. The upper end 32t is an end portion opposite side to the second barrier region 22 of the second base region 32. The upper end d12t of the second gate electrode D12 is located below the upper end 31t of the first base region 31 and the upper end 32t of the second base region 32.

The lower end d11b of the first gate electrode D11 is located at the same position as the lower end d12b of the second gate electrode D12. Thus, the length in the Z-direction of the second gate electrode D12 is shorter than the length in the Z-direction of the first gate electrode D11. Accordingly, in the source electrode D3, the portion D3p located above the second gate electrode D12 is in contact with part of the side surface of the second base region 32. The portion D3p is Schottky connected to the second base region 32.

In the semiconductor device 140, a first trench gate structure TG1 including the first gate electrode D11 and a second trench gate structure TG2 including the second gate electrode D12 are arranged alternately in the X-direction. Furthermore, between the first trench gate structure TG1 and the second trench gate structure TG2, the first structural body ST1 or the second structural body ST2 is disposed.

In the semiconductor device 140 shown in FIG. 12, the first structural body ST1, the first trench gate structure TG1, the second structural body ST2, and the second trench gate structure TG2 are repetitively arranged in this order in the X-direction. Here, the first structural body ST1, the first trench gate structure TG1, the second structural body ST2, and the second trench gate structure TG2 may be repetitively arranged in the X-direction in the order of the first structural body ST1, the first trench gate structure TG1, the second structural body ST2, the second trench gate structure TG2, the second structural body ST2, the first trench gate structure TG1, and the first structural body ST1.

In this semiconductor device 140, the second base region 32 of the second structural body ST2 is in contact with the source electrode D3. Thus, in this configuration, holes are ejected from the second base region 32 to the source electrode D3.

Here, the holes injected from the drift region 10 via the second barrier region 22 into the second base region 32 are ejected to the source electrode D3 from the portion of the second gate electrode D12 in contact with the source electrode D3. Thus, as the length $L_1$ in the Z-direction of the portion of the source electrode D3 in contact with the second base region 32 is made wider, the ejection of holes is made smoother. For instance, it is preferable to set $L_1 \geq 0.05$ μm.

Thus, holes are not stored in the second base region 32. Accordingly, threshold variation is suppressed. Furthermore, this reduces the ejection resistance of holes ejected from the drift region 10 via the second base region 32 to the source electrode D3. Thus, holes generated in the drift region 10 are smoothly ejected. This improves the breakdown withstand capability.

Here, when the second gate electrode D12 is applied with a positive gate voltage, electrons are attracted to form an inversion layer near the interface of the second base region 32 with the gate insulating film 80. If this inversion layer spreads, a current path is formed from the source electrode D3 to the drift region 10. Then, an excessive current may flow. This can be avoided by widening to some extent the spacing $L_2$ in the Z-direction between the second gate electrode D12 and the source electrode D3. For instance, it is preferable to set $L_2 \geq 0.05$ μm.

In this semiconductor device 140 according to the fifth embodiment, in addition to working effects similar to those in the semiconductor devices 110, 120, and 130, improvement in breakdown withstand capability is greater than in the semiconductor device 130.

As described above, the semiconductor devices according to the embodiments can achieve lower on-resistance and higher breakdown voltage.

The embodiments and the variations thereof have been described above. However, the invention is not limited to these examples. For instance, those skilled in the art can modify the above embodiments or the variations thereof by suitable addition, deletion, and design change of components, and by suitable combination of the features of the embodiments. Such modifications are also encompassed within the scope of the invention as long as they fall within the spirit of the invention.

For instance, in the description of the above embodiments and the variations thereof, the first conductivity type is n-type, and the second conductivity type is p-type. However, the invention is also practicable when the first conductivity type is p-type and the second conductivity type is n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first semiconductor region of a first conductivity type;
    a second semiconductor region of the first conductivity type provided contact with the first semiconductor region and having an impurity concentration higher than an impurity concentration of the first semiconductor region;
    a third semiconductor region of a second conductivity type provided on a side opposite to the first semiconductor region of the second semiconductor region and being in contact with the second semiconductor region;
    a fourth semiconductor region of the first conductivity type being in contact with at least part of the third semiconductor region and having an impurity concentration higher than an impurity concentration of the second semiconductor region;
    a fifth semiconductor region of the second conductivity type provided on a side opposite to the second semiconductor region of the first semiconductor region;
    a first electrode provided together with the first semiconductor region in a first direction, the first electrode provided together with the third semiconductor region in a second direction, and the first electrode having an end portion of the first semiconductor region side located nearer to the first semiconductor side than a boundary between the second semiconductor region and the third semiconductor region, where a stacking direction of the first semiconductor region and the second semiconductor region is defined as a first direction, a direction orthogonal to the first direction is defined as the second direction, and a direction orthogonal to the first direction and the second direction is defined as a third direction;
    a second electrode provided between the first electrode and the first semiconductor region and being in electrical continuity with the fourth semiconductor region; and
    a third electrode being in contact with the fourth semiconductor region.

2. The device according to claim 1, further comprising:
    a sixth semiconductor region of the second conductivity type provided on a side opposite to second semiconductor region of the third semiconductor region, the sixth semiconductor region being in contact with the third semiconductor region, the sixth semiconductor region having an impurity concentration higher than an impurity concentration of the third semiconductor region, and the sixth semiconductor region provided together with the fourth semiconductor region in the third direction.

3. The device according to claim 2, wherein
    the fourth semiconductor region is provided in a plurality, and
    the sixth semiconductor region is provided in a plurality,
    each of the plurality of fourth semiconductor regions and each of the plurality of sixth semiconductor regions are arranged alternately in the third direction.

4. The device according to claim 1, wherein
    the second semiconductor region includes a first second semiconductor region provided on one side in the second direction of the second electrode, and a second second semiconductor region provided on another side in the second direction of the second electrode,
    the third semiconductor region includes a first third semiconductor region and a second third semiconductor region, the first third semiconductor region being provided on a side opposite to the first semiconductor region of the first second semiconductor region and being in contact with the first second semiconductor region, the second third semiconductor region being provided on a side opposite to the first semiconductor region of the second second semiconductor region and being in contact with the second second semiconductor region,
    the fourth semiconductor region being provided on a side opposite to the second second semiconductor region of the first third semiconductor region, and
    the fourth semiconductor region is not provided on the second third semiconductor region.

5. The device according to claim 4, wherein the second third semiconductor region is not in electrical continuity with the third electrode.

6. The device according to claim 4, wherein the second third semiconductor region is in electrical continuity with the third electrode.

7. The device according to claim 1, wherein
    the second semiconductor region includes a first second semiconductor region provided on one side in the second direction of the second electrode, and a second second semiconductor region provided on another side in the second direction of the second electrode,
    the third semiconductor region includes a first third semiconductor region and a second third semiconductor region, the first third semiconductor region being provided on a side opposite to the first semiconductor region of the first second semiconductor region and being in contact with the first second semiconductor region, the second third semiconductor region being provided on a side opposite to the first semiconductor region of the second second semiconductor region and being in contact with the second second semiconductor region,
    the first electrode includes a first first electrode provided between the first third semiconductor region and the second third semiconductor region, and a second first electrode provided on an opposite side of the second third semiconductor region from the first first electrode,
    an end of the first first electrode opposite side to the second electrode is located above an end of the first third semiconductor region opposite side to the first second semiconductor region and an end of the second third semiconductor region opposite side to the second second semiconductor region, an upper end of the second first electrode is located below the upper end of the first third semiconductor region and the upper end of the second third semiconductor region, the fourth semiconductor region is provided on the first third semiconductor region, and the fourth semiconductor region is not provided on the second third semiconductor region.

8. The device according to claim 7, further comprising:

a sixth semiconductor region provided on the second third semiconductor region, being in contact with the second third semiconductor region, having an impurity concentration higher than an impurity concentration of the third semiconductor region, and being in contact with the third electrode.

9. The device according to claim 1, wherein the second semiconductor region, the third semiconductor region, the first electrode, and the second electrode each extend in the third direction.

10. The device according to claim 1, further comprising:

an insulating film provided between the first electrode and the third semiconductor region.

11. The device according to claim 1, wherein the impurity concentration of the second semiconductor region is less than $1 \times 10^{17}$ cm$^{-3}$.

12. The device according to claim 1, wherein the third electrode is Schottky connected to the third semiconductor region.

13. The device according to claim 1, further comprising:

a sixth semiconductor region of the second conductivity type provided on a side opposite to the second semiconductor region of the third semiconductor region, being in contact with the third semiconductor region, having an impurity concentration higher than an impurity concentration of the third semiconductor region, and provided together with the fourth semiconductor region in the third direction, and the third electrode being ohmically connected to the third semiconductor region via the sixth semiconductor region.

14. The device according to claim 7, wherein the second third semiconductor region is separated from the third electrode in the first direction by 0.05 micrometers or more.

15. The device according to claim 7, wherein the second third semiconductor region is separated from the second first electrode in the first direction by 0.05 micrometers or more.

* * * * *